United States Patent [19]

Chihara et al.

[11] 4,051,663
[45] Oct. 4, 1977

[54] ELECTRONIC TIMEPIECE

[75] Inventors: Hiroyuki Chihara, Okaya; Hitomi Numabe, Suwa, both of Japan

[73] Assignee: Kabushiki Kaisha Suwa Seikosha, Tokyo, Japan

[21] Appl. No.: 529,881

[22] Filed: Dec. 5, 1974

[30] Foreign Application Priority Data

Dec. 5, 1973 Japan .................................. 48-135301

[51] Int. Cl.² .............................................. G04C 13/08
[52] U.S. Cl. .................................. 58/26 R; 58/23 R; 58/85.5; 58/35 W
[58] Field of Search ................... 58/23 R, 85.5, 35 W, 58/35 R, 33, 23 A, 34, 26 R, 24 R

[56] References Cited

U.S. PATENT DOCUMENTS

| 2,786,972 | 3/1957 | Dreier et al. ................. 58/35 W X |
| 3,530,663 | 9/1970 | Marti ............................ 58/35 X |
| 3,541,779 | 11/1970 | Langley ..................... 58/26 R X |
| 3,777,471 | 12/1973 | Koehler et al. ............... 58/23 R |
| 3,812,670 | 5/1974 | Nikaido et al. ................ 58/23 R |
| 3,852,953 | 12/1974 | Mischiatti .................... 58/26 X |
| 3,895,486 | 7/1975 | Hammer et al. ............. 58/85.5 X |
| 3,914,931 | 10/1975 | Tsuruishi ...................... 58/23 R |
| 3,916,612 | 11/1975 | Morokawa et al. .......... 58/85.5 X |
| 3,948,036 | 4/1976 | Morokawa .................. 58/85.5 X |

OTHER PUBLICATIONS

A. Barna, et al., "Integrated Circuits in Digital Electronics," pp. 158-161, John Wiley & Sons, New York, 1973.

Primary Examiner—Ulysses Weldon
Attorney, Agent, or Firm—Blum, Moscovitz, Friedman & Kaplan

[57] ABSTRACT

An electronic timepiece wherein the period of the timekeeping signal produced by the divider circuit is adjusted in response to an externally applied reference signal is provided. The electronic timepiece includes an oscillator circuit for producing a high frequency time standard signal, a divider circuit including a plurality of series-connected divider stages adapted to produce a low frequency timekeeping signal in response to the time standard signal, and a display for displaying time in response to the timekeeping signal. A receiving circuit receives an externally applied reference signal corresponding to actual time, and a comparator circuit compares the high frequency time standard signal against the reference signal and in response thereto produces a frequency difference signal. A memory circuit is adapted to store the frequency difference signal. A division ratio regulation circuit in response to the frequency difference signal stored in the memory circuit regulates the division ratio of the divider circuit to thereby produce a timekeeping signal representative of actual time.

10 Claims, 6 Drawing Figures

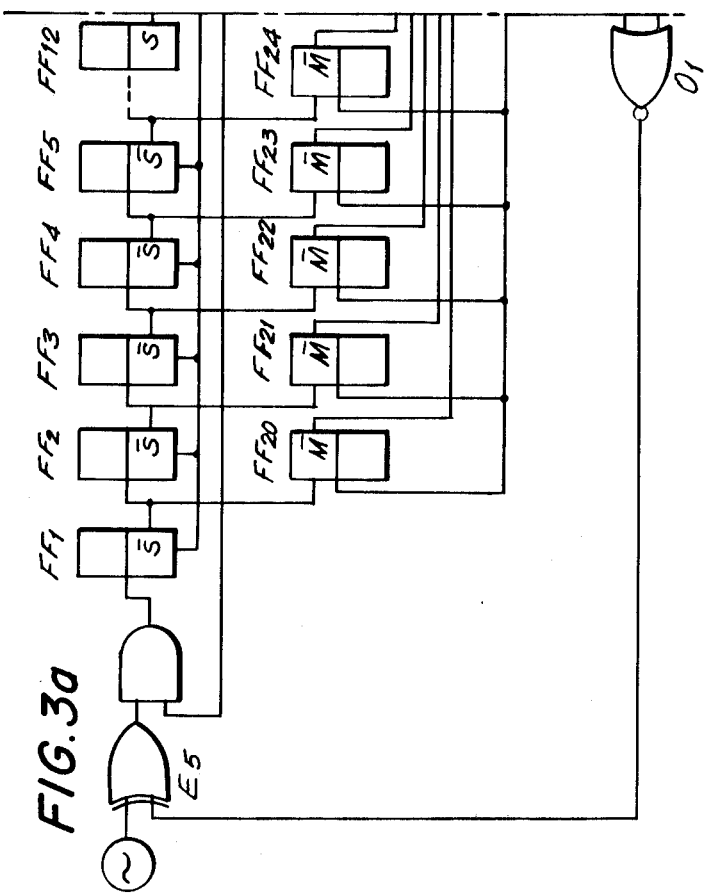
FIG.3a
FIG.4
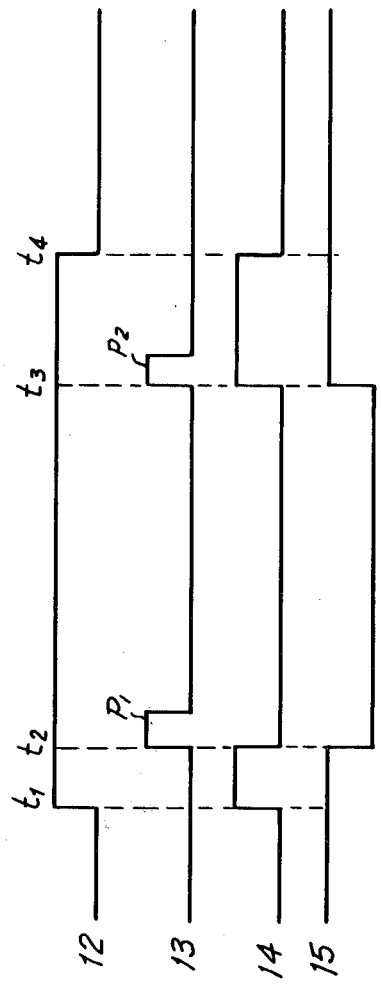
FIG.5

ELECTRONIC TIMEPIECE

BACKGROUND OF THE INVENTION

This invention is directd to an electronic timepiece, and in particular to a quartz crystal electronic timepiece wherein the division ratio of the divider circuit is automatically regulated in response to an external reference signal.

In prior art quartz crystal electronic timepieces, adjustment of the oscillating frequency was effected by tuning the quartz crystal oscillator circuit to regulate the accuracy of the timekeeping signals produced by the divider circuit. Such tuning was usually accomplished by changing or varying the capacitance of a trimmer capacitor in the oscillator circuit. Nevertheless, it was found that such trimmer capacitors were less then completely satisfactory because of the movable parts thereof. Moreover, because the small size of an electronic wristwatch requires the components of the timekeeping circuit to be of a miniature size, the range of capacitance was of necessity, limited, thereby considerably limiting the range over which the oscillating circuit could be tuned. Additionally, the mechanical movement required to adjust the capacitor and hence tune the oscillator circuit could not be done without experiencing considerable difficulty.

The popularity of quartz crystal electronic wristwatches, has rendered the use of inexpensive quartz crystal vibrators particularly desirable, in view of the savings provided thereby, as well as the stable operation which same affords. Accordingly, division ratio regulation circuits have been developed to regulate the division ratio of the divider circuit to produce an accurate timekeeping signal in response to an advanced or retarded high frequency timekeeping signal produced by a quartz crystal oscillator circuit. However, in the division ratio regulating circuits heretofore proposed, the number of input terminals required to establish a division ratio regulating quantity have increased, thereby increasing the size of the electronic wristwatch including same. Additionally, although such multi-terminal division ratio regulating circuits have lowered the cost of such electronic wristwatches utilizing same, the complicated nature of the circuitry utilized to provide the necessary regulation proved to be less than completely satisfactory.

SUMMARY OF THE INVENTION

Generally speaking, in accordance with the invention, an electronic timepiece adapted to have the division ratio of the dividing circuit automatically adjusted in response to an externally applied reference signal is provided. The electronic timepiece includes an oscillator circuit for producing a high frequency time standard signal, a divider circuit including a plurality of series-connected divider stages adapted in response to the time standard signal to produce a low frequency timekeeping signal and a display for displaying time in response to the timekeeping signal. In response to an externally applied reference signal, a reference circuit produces a reference signal corresponding to actual time, and a comparator circuit compares the high frequency time standard signal with the reference signal and in response thereto produces a frequency difference signal. A memory circuit is adapted to store the frequency difference signal. A division ratio regulating circuit is coupled to the divider circuit and in response to the frequency difference signal stored in the memory, regulates the division ratio of the divider circuit to produce a timekeeping signal representative of actual time.

Accordingly, it is an object of this invention to provide an improved electronic timepiece wherein the accuracy of the timekeeping signal is automatically regulated.

Another object of this invention is to provide an improved quartz crystal electronic wristwatch wherein the division ratio of the divider circuit is automatically regulated in response to an externally applied reference signal.

Still other objects and advantages of the invention will in part be obvious and will in part be apparent from the specification.

The invention accordingly comprises the features of construction, combination of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 3a and 3b are partial circuit diagrams of an electronic timepiece circuit constructed in accordance with the embodiment depicted in FIGS. 1 and 2;

FIG. 4 is a detailed circuit diagram of a master-slave flip-flop circuit of the type depicted in FIG. 3; and FIG. 5 is a timing diagram representative of the operation of the electronic timepiece circuit depicted in FIGS. 3a and 3b.

DETAILED DESCRIPTION OF THE PREFFERED EMBODIMENTS

Figure 1:
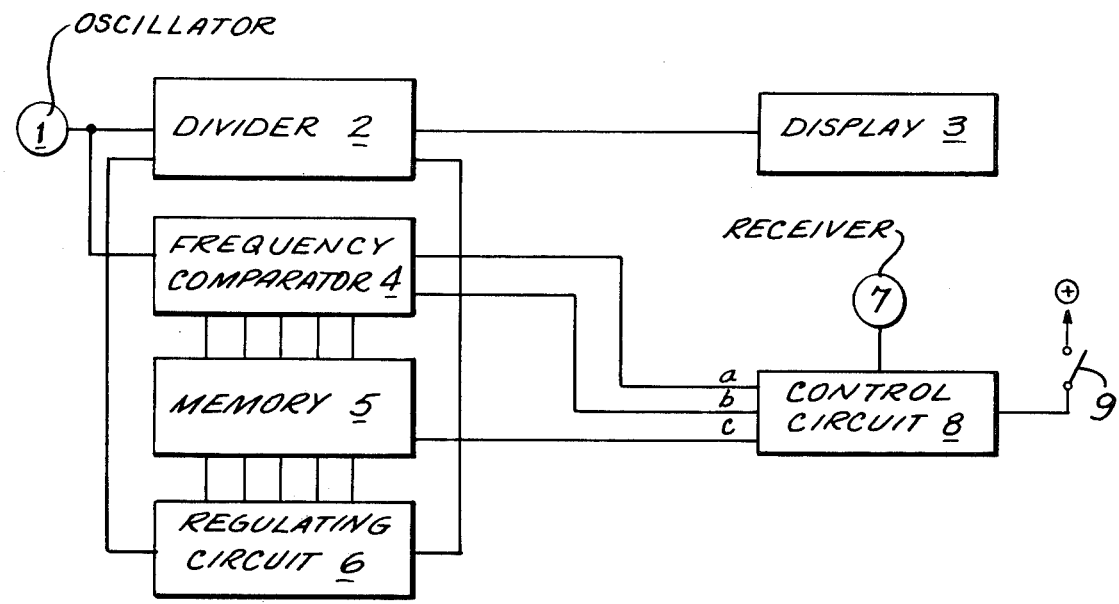
FIG. 1 is a block circuit diagram of a division ratio regulating circuit adapted to be adjusted in response to an externally applied reference signal constructed in accordance with the instant invention.

Reference is now made to FIG. 1 wherein an automatic division ratio regulating circuit for an electronic timepiece is depicted. An oscillator circuit 1, preferably utilizing a quartz crystal vibrator as a time standard, is adapted to apply a high frequency time standard signal to a divider circuit 2 comprised of a plurality of series-connected master-slave flip-flop binary divider stages. A display 3 is adapted to display time counted by the divider circuit 2 in response to the timekeeping signals produced thereby.

A frequency comparator 4 is also adapted to receive the high frequency standard signal produced by oscillator circuit 1. A manually operated two position regulating switch 9 is coupled to a control circuit 8 and in response to closing switch 9, a receiver 7 receives a reference signal from an external source, and applies same to the frequency comparator 4. The frequency comparator 4 compares the high frequency time standard signal to the reference signal and produces frequency difference signals representative of the frequency therebetween. A memory 5 is adapted to store the frequency difference signals produced by the frequency comparator 4 and in response to a control signal from control circuit 8, apply the stored difference signal to a regulating circuit 6 adapted to regulate the division ratio of the divider circuit in response to the application thereto of the difference signal and a signal from one or more of the low frequency divider stages of divider circuit 2.

Specifically, when switch 9 is closed, a reset signal *a* is applied to the frequency comparator 4 to reset same. Immediately thereafter, a reference signal having a period such as 1 or 2 seconds is applied to receiver 7 and at the termination thereof, a reference signal *b* is applied to the frequency comparator 4 coincident with the application of a memory store signal *c* to memory 5 to effect storing of the frequency difference signals in the memory 5, thereby completing the determination of the amount by which the division ratio is to be regulated by regulating circuit 6. Thereafter, switch 9 is opened in order to avoid any noise from affecting the frequency difference signals stored in the memory. Accordingly, regulation of the division ratio is automatically achieved in response to an external reference signal produced by the actuation of a single switch.

Figure 2:
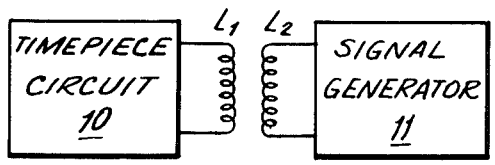
FIG. 2 is a block circuit diagram of a generator for producing a reference signal in accordance with the preferred embodiment of the instant invention.

Reference is now made to FIG. 2 wherein a preferred embodiment of the circuit utilized to produce the externally applied reference signal to the timepiece circuit is depicted. A signal generator 11 is coupled to the timepiece circuit 10 through a transformer coupling including coils $L_1$ and $L_2$. Signal generator 11 generates a time standard signal having an exact predetermined period of two seconds. Receiving coil $L_1$ is electro-magnetically coupled to transmitting coil $L_2$ and in response to the predetermined reference signal produced by signal generator 11 applies a reference signal to the timepiece circuit 10 to be compared with the high frequency time standard signal by the frequency comparator 4 in the manner noted above, to effect automatic regulation of the division ratio of the divider circuit.

Figure 3B:
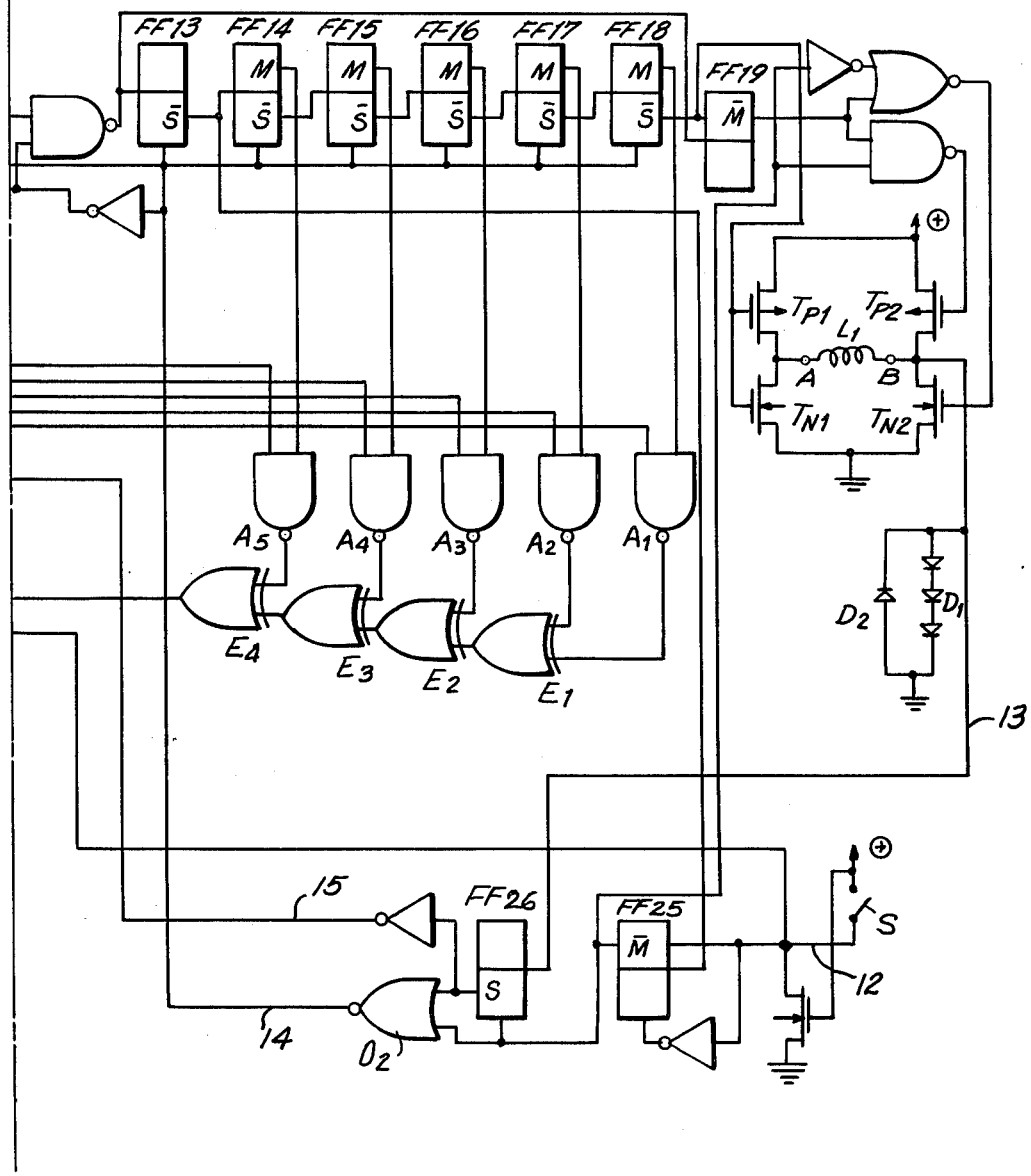

Reference is now made to FIGS. 3*a* and 3*b* wherein a detailed circuit diagram of a preferred embodiment of the electronic timepiece adjustment circuit illustrated in FIGS. 1 and 2 is depicted. The electronic divider circuit 2 includes series-connected flip-flop circuits $FF_1$ to $FF_{18}$ which are comprised of master-slave flip-flop circuits specifically detailed in FIG. 4. Additionally, flip-flops $FF_{19}$ through $FF_{26}$ are master-slave flip-flop circuits and are more particularly described below. Specifically, referring to the master-slave flip-flop circuit depicted in FIG. 4, the input terminals include a data input terminal D and a clock input terminal CL. The output terminals of the circuit include master signal output terminals $Q_M$ and $\overline{Q_M}$ (the complement of $Q_M$) and slave output terminals $Q_S$ and $\overline{Q_S}$ (the complement of $Q_S$). Additionally each master-slave flip-flop includes a reset terminal R. The data input terminal D and reset terminal R of the flip-flop circuits $FF_1$ through $FF_{26}$ are not shown in detail in FIG. 3 for purposes of simplifying the explanation therein, it being understood that the D terminal of each flip-flop is coupled to the $Q_S$ terminal of the preceeding flip-flop and the R and ground terminals are referenced to a minus potential.

Flip-flops $FF_1$ through $FF_{18}$ comprise the dividing circuit 2. Flip-flops $FF_1$ through $FF_5$ are also utilized as the frequency comparator circuit 4. The division ratio regulating circuits 6 includes EXCLUSIVE OR gates $E_1$ through $E_5$ and NAND gates $A_1-A_5$ which define a feedback loop for selected low frequency signals produced by flip-flops $FF_{13}$ through $FF_{18}$ and the input to the divider circuit 2 through EXCLUSIVE OR gate $E_5$. The amount of regulation to be effected is controlled by the passing of selected combinations of low frequency divider stage signals by NAND gates $A_1$ through $A_5$ determined by the frequency difference signals stored in the memory defined by flip-flops $FF_{20}$ through $FF_{24}$. The passed signals are combined by EXCLUSIVE OR gates $E_1$ through $E_4$ and applied through EXCLUSIVE OR gate $E_5$ to the divider circuit. Flip-flop $FF_{19}$ defines a delaying circuit for driving an electro-mechanical converter in respsonse to the signals produced at the $Q_S$ terminal and $Q_M$ terminals of flip-flops 18 and 19, respectively. The coil $L_1$ of the electro-mechanical converter, such as a step motor, is disposed in a drive circuit including MOS field effect transistors $T_{P1}$, $T_{P2}$, $T_{N1}$ and $T_{N2}$ which allow a considerable amount of current to be applied in response to driving same. Flip-flops $FF_{25}$ and $FF_{26}$ and NOR gate $O_2$ comprise the control circuit 8 discussed above, and NOR gate $O_1$ defines a gate which enables the regulation of the division ratio to be held in abeyance while the regulating quantity is established.

When the reset switch S is actuated by closing of same, the switch S is referenced to a positive potential to thereby apply a 1 to flip-flop 25, to thereby reference the M terminal to 0. Accordingly, the 0 output M of flip-flop $FF_{25}$ is applied to NOR gate $O_2$, and since the output S of flip-flop $FF_{26}$ remains at 0 the coincident application of 0 inputs to NOR gate $O_2$ references the output 14 thereof to a 1 and hence produces a reset pulse, thereby resetting the divider circuits, thereby stopping the timepiece counting function in response to reset switch S being actuated, and hence effecting a resetting of flip-flop $FF_{18}$; $T_{N1}$ is thereby placed on, and the remaining MOS field effect transistors off. Specifically, the resetting of flip-flop $FF_{18}$ to 0 references the S terminal to a 1 and effects a referencing of the gate electrodes of transistors $T_{P1}$ and $T_{N1}$ to 1, thereby placing transistor $T_{N1}$ in an ON and transistor $T_{P1}$ in an OFF switching state. As noted above, since M terminal of flip-flop $FF_{25}$ is referenced to a 0 potential by the closing of switch S, the output thereof is applied to the drive circuit transistors $T_{P2}$ and $T_{N2}$ through the NAND gate and NOR gate respectively coupled to the gate electrodes of the transistors to place transistors $T_{P2}$ and $T_{N2}$ in an OFF switching state. Accordingly, terminal A of the driving coil $L_1$ is referenced to ground which, as noted above is at a minus potential, and terminal B floats with respect to the reference potential so that the drive coil $L_1$ functions as a receiving coil to receive the reference signal applied thereto. A diode clamping circuit including diodes $D_1$ and $D_2$ effects a clamping of the reference signal received by coil $L_1$ and applies the shaped signal to the control circuit.

Reference is made to the timing diagrams depicted in FIG. 5 and the manner in which same are produced by the operation of the quartz crystal electronic timepiece depicted in FIGS. 3*a* and 3*b* is described below. In response to a closing of switch S, a terminal voltage 12 is applied at a time $t_1$. As detailed above, responsive to the actuation of switch S, by closing of same, each of the divider stages $FF_1$ through $FF_{18}$ are reset and in view of the referencing of terminal A of the driving coil $L_1$ to ground and terminal B to the referenced potential in the manner detailed above to render drive coil $L_1$ a receiving coil, a first pulse $p_1$ of the external reference signal 13 is applied at time $t_2$. As detailed above, reset signal 14 is applied to the divider circuit to reset each of the divider stage counters during the interval between $t_1$ and $t_2$ by the closing of switch S. Upon application of the first pulse $p_1$ the external reference signal 13 at the time $t_2$, the frequency comparator circuit comprised of flip-flops $FF_1$ through $FF_5$ begins counting. The application of the leading edge of the 1 pulse $p_1$ to the flip-flop $FF_{26}$ causes the output S thereof to be changed to a 1 and thereby places the divider circuit reset output signal 14 of NOR gate $O_2$ at 0. Additionally, as depicted in FIG. 5, the memory control signal 15 is reference to 0 by a changing of the output S of flip-flop $FF_{26}$ to 1, to thereby permit the outputs of flip-flops $FF_1$ through $FF_5$ to be applied to the respective memory flip-flops coupled thereto. The output of each counter $FF_1$ through $FF_5$ is respectively applied to the memory circuit comprised of flip-flops $FF_{20}$ through $FF_{24}$, the outputs of the flip-flops $FF_1$ through $FF_5$ being applied to the memory circuit representing the frequency difference signals discussed above. Accordingly, the frequency difference signals are written into the memory flip-flops until a second reference pulse $p_2$ is received by coil $L_1$ at a time $t_3$ whereafter the writing into the memory flip-flop is terminated, and, the states of the flip-flops $FF_{20}$ through $FF_{24}$ are established to thereby provide effective gating signals to the respective first terminals of the NAND gates $A_1$ through $A_5$ in the division ratio regulating circuit. Accordingly, the frequency difference signals are continually applied to the division ratio regulating circuit during normal operation of the timekeeping circuit when switch S is open. The division ratio regulating circuit effects regulation of the division ratio of the divider circuit once the count of the divider circuits is reset and placed in a normal timekeeping operation. Accordingly, reset signal 14 is applied to each of the flip-flops comprising the divider circuit to reset same to zero at $t_3$ and upon opening of the switch S at a time $t_4$, the timepiece once again operates in a normal timekeeping mode, with the timekeeping signals produced thereby being representative of actual and exact time.

Although the embodiment depicted above illustrates the division ratio regulation circuit wherein the quartz crystal vibrator is selected to oscillate at a frequency below the ideal frequency, and the division ratio regulating circuit is adapted to advance or increase the count of the divider circuit in response thereto, the instant invention is not limited thereto. By utilizing a division ratio regulating circuit adapted to retard or inhibit the count of the divider circuit, a time standard having a natural frequency above the ideal frequency can be utilized to retard the count of the divider circuit. Thus, automatic regulation of the division ratio of the divider circuit over a wide range of frequencies can be achieved by utilizing a signal generator adapted to generate an external reference time signal having an accurate period.

It will thus be seen that the objects set forth above, among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. In an electronic timepiece having oscillator means for producing a high frequency time standard signal, divider means including a plurality of series-connected divider stages adapted in response to said time standard signal to produce a low frequency timekeeping signal, and display means for displaying time in response to said timekeeping signals, the improvement comprising receiving means adapted to receive an externally applied actual time reference signal for at least a predetermined actual time interval, comparator means coupled to said oscillator means and adapted to compare the period counted from said high frequency time standard signal during the predetermined actual time interval of said reference signal with the actual time interval of said externally applied reference signal received by said receiving means, and in response thereto produce a frequency difference signal representative of the difference between the high frequency time standard frequency required to produce the predetermined actual time interval and the high frequency time standard signal output of said oscillator means, memory means adapted to store said frequency difference signal, and division ratio regulating means coupled to said divider means for regulating the division ratio of said divider means to produce a timekeeping signal having a period representative of actual time in response to said frequency difference signal stored in said memory means being applied thereto.

2. An electronic timepiece as claimed in claim 1, and including control means, said control means being adapted to reset said series-connected divider stages prior to application of an external reference signal to said receiving means, said comparator means including certain of said divider stages in said divider circuit.

3. An electronic timepiece as claimed in claim 1 and including a control circuit intermediate said receiving means and said frequency comparator means and memory means, said control circuit including switch means, actuation of said switch means effecting application of said reference signal to said comparator means and additionally effecting a storing by said memory means of the frequency difference signal produced by the comparator.

4. An electronic timepiece as claimed in claim 3 wherein said control circuit additionally applies a reset signal to the comparator circuit in response to the actuation of said switch means.

5. An electronic timepiece as claimed in claim 4, wherein the receiver includes an electro-magnetic sensing means adapted, in response to the application of an external reference signal produced by an external signal source to be magnetically coupled thereto, and produce a reference signal having a period equal to the signal applied from the external signal source.

6. An electronic timepiece as claimed in claim 5 wherein said comparator means includes certain of the divider stages in said divider means, each of said divider stages being reset to zero upon the actuation of said switch means, said certain divider stages being adapted in response to said externally applied reference signal to count during the period thereof, said divider stages once again producing timekeeping signals in response to termination of said reference signal applied thereto.

7. An electronic timepiece as claimed in claim 5 wherein said electro-magnetic sensing means includes a transformer coil adapted to be magnetically coupled to an external signal source having a transformer coil output terminal.

8. An electronic timepiece as claimed in claim 5 wherein certain other of said divider stages in said divider means produce low frequency signal in response to said high frequency time standard signal, said division ratio regulating means being adapted to coincidently receive said low frequency signals and said frequency difference signal and in response thereto apply a division ratio regulating signal to said divider means to regulate the division ratio thereof.

9. An electronic timepiece as claimed in claim 8 wherein said certain divider stages comprising said comparator means are flip-flop circuits, and said memory means includes flip-flop circuits associated with each comparator divider stage, the state of each of said memory flip-flops being set in response to the state of the comparator flip-flop associated therewith, when same is comparing said time standard signal with said external reference signal.

10. An electronic timepiece as claimed in claim 9 wherein said division ratio regulating means includes gating means controlled by said frequency difference signal, the state of each of said memory flip-flops upon termination of said reference signal applied to said comparator means comprising the frequency difference signal applied to said gating means.

* * * * *